US006954091B2

(12) United States Patent
Wurzer

(10) Patent No.: US 6,954,091 B2
(45) Date of Patent: Oct. 11, 2005

(54) PROGRAMMABLE PHASE-LOCKED LOOP

(75) Inventor: Steven G. Wurzer, Spring Lake Park, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/721,843

(22) Filed: Nov. 25, 2003

(65) Prior Publication Data

US 2005/0110537 A1 May 26, 2005

(51) Int. Cl.[7] .................................................. H03L 7/06

(52) U.S. Cl. ....................... 327/156; 327/162; 327/146; 327/159; 331/DIG. 2; 375/376

(58) Field of Search ................................ 327/156, 157, 327/159, 162, 146–148, 150, 163; 331/DIG. 2, 1 A, 1 R; 375/373–376

(56) References Cited

U.S. PATENT DOCUMENTS

| | | | | |
|---|---|---|---|---|
| 5,389,898 A | * | 2/1995 | Taketoshi et al. | 331/2 |
| 5,686,864 A | * | 11/1997 | Martin et al. | 331/1 A |
| 5,909,149 A | | 6/1999 | Bath et al. | 331/21 |
| 6,078,317 A | * | 6/2000 | Sawada | 345/204 |
| 6,188,285 B1 | * | 2/2001 | Nakanishi et al. | 331/2 |
| 6,229,399 B1 | * | 5/2001 | Tobise et al. | 331/17 |
| 6,462,594 B1 | * | 10/2002 | Robinson et al. | 327/159 |
| 6,512,801 B1 | * | 1/2003 | Ninomiya | 375/316 |
| 6,774,732 B1 | * | 8/2004 | Harnishfeger et al. | 331/25 |
| 6,785,525 B2 | * | 8/2004 | Ries | 455/258 |
| 2002/0001361 A1 | | 1/2002 | Ueno et al. | 375/376 |
| 2003/0060177 A1 | | 3/2003 | Noboru et al. | 455/260 |
| 2003/0143950 A1 | | 7/2003 | Maldonado | 455/17 |

FOREIGN PATENT DOCUMENTS

| | | |
|---|---|---|
| EP | 0874463 | 10/1999 |
| JP | 06303134 | 10/1994 |

* cited by examiner

*Primary Examiner*—Tuan T. Lam
*Assistant Examiner*—Hai L. Nguyen
(74) *Attorney, Agent, or Firm*—Westman, Champlin & Kelly

(57) ABSTRACT

An integrated circuit is provided, which includes a phase-locked loop (PLL) that is fabricated on the integrated circuit and has a selectable loop filter capacitance and a selectable output frequency range.

17 Claims, 9 Drawing Sheets

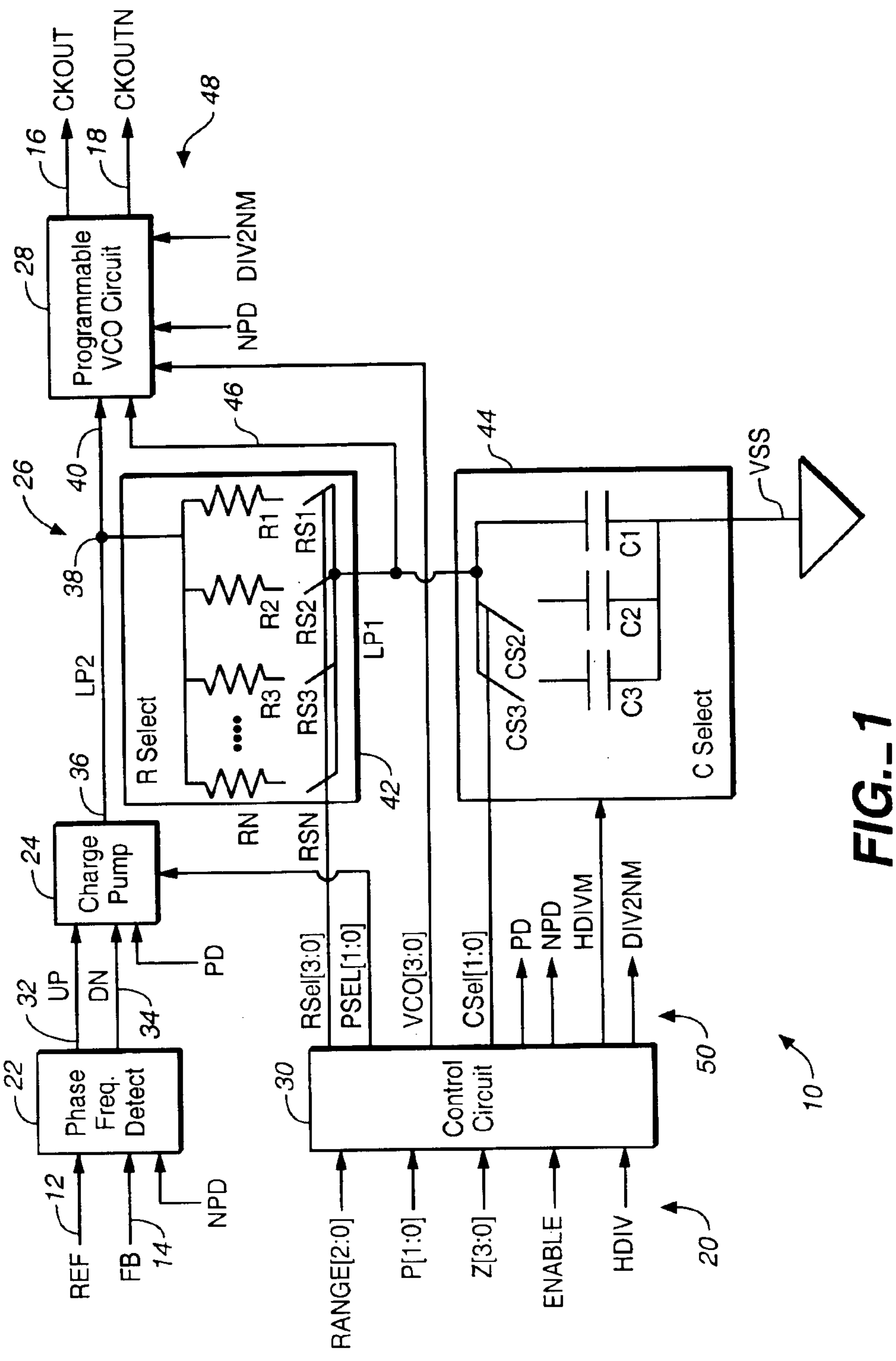
FIG._1

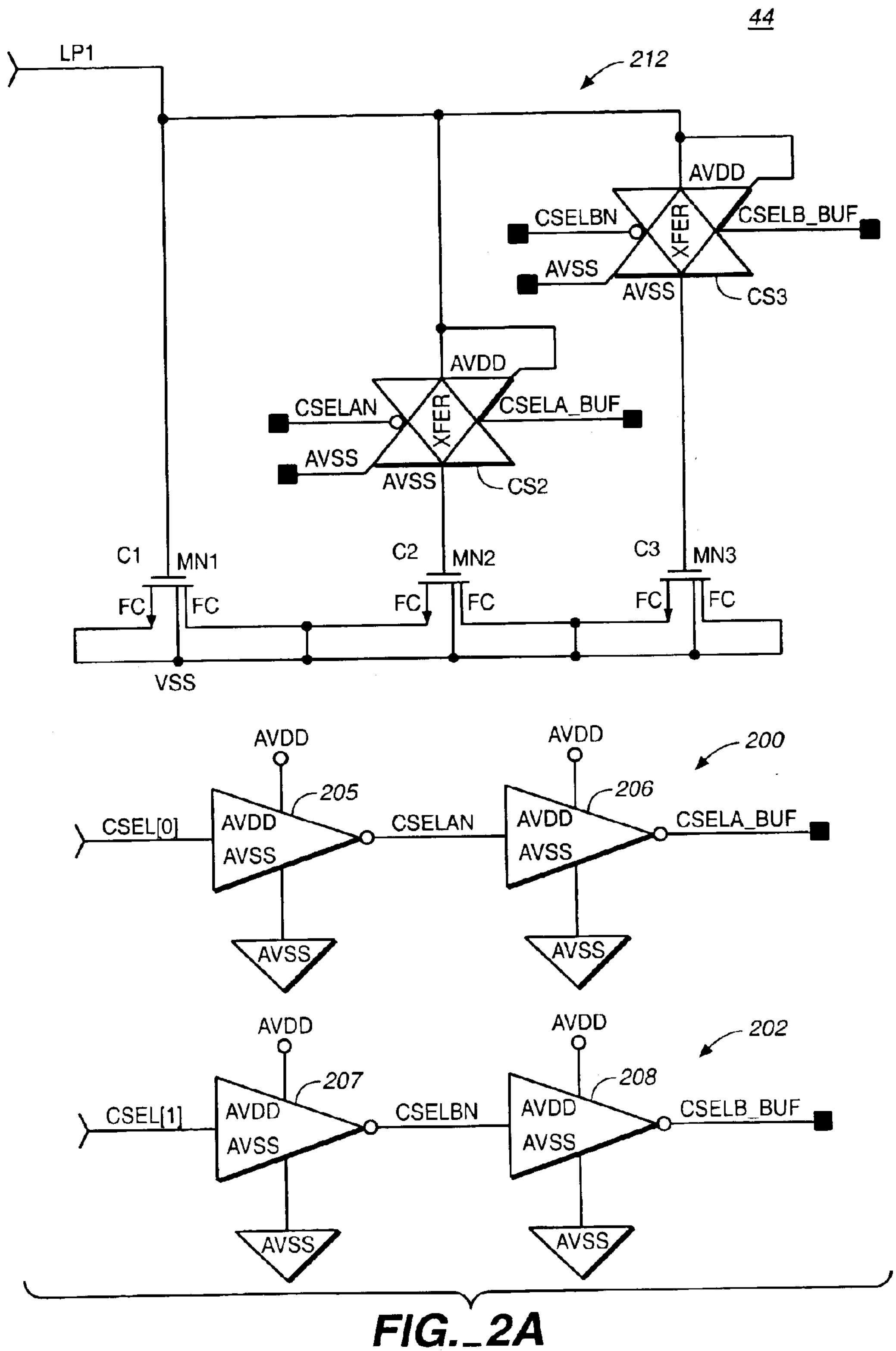
FIG._2A

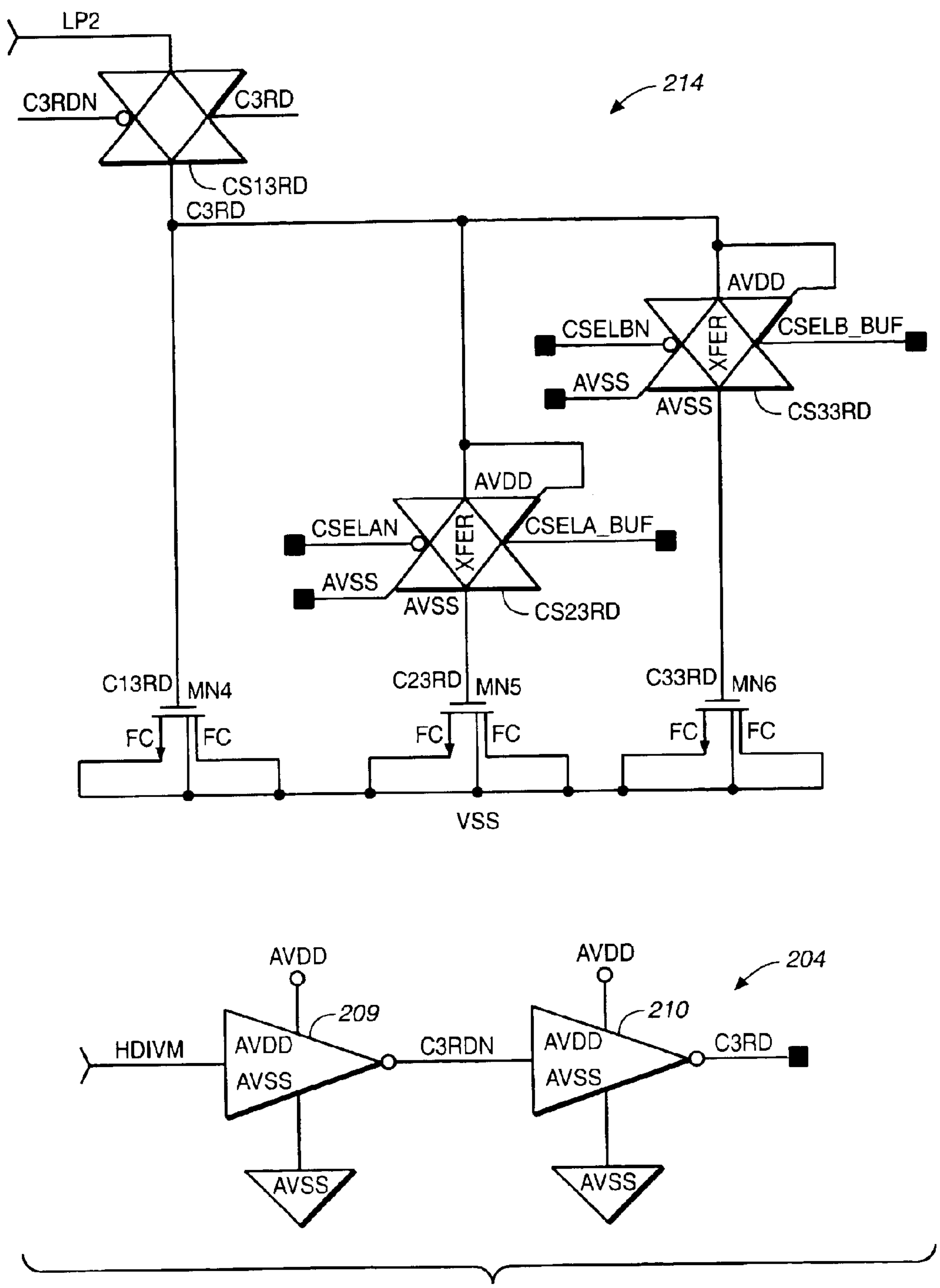
FIG._2B

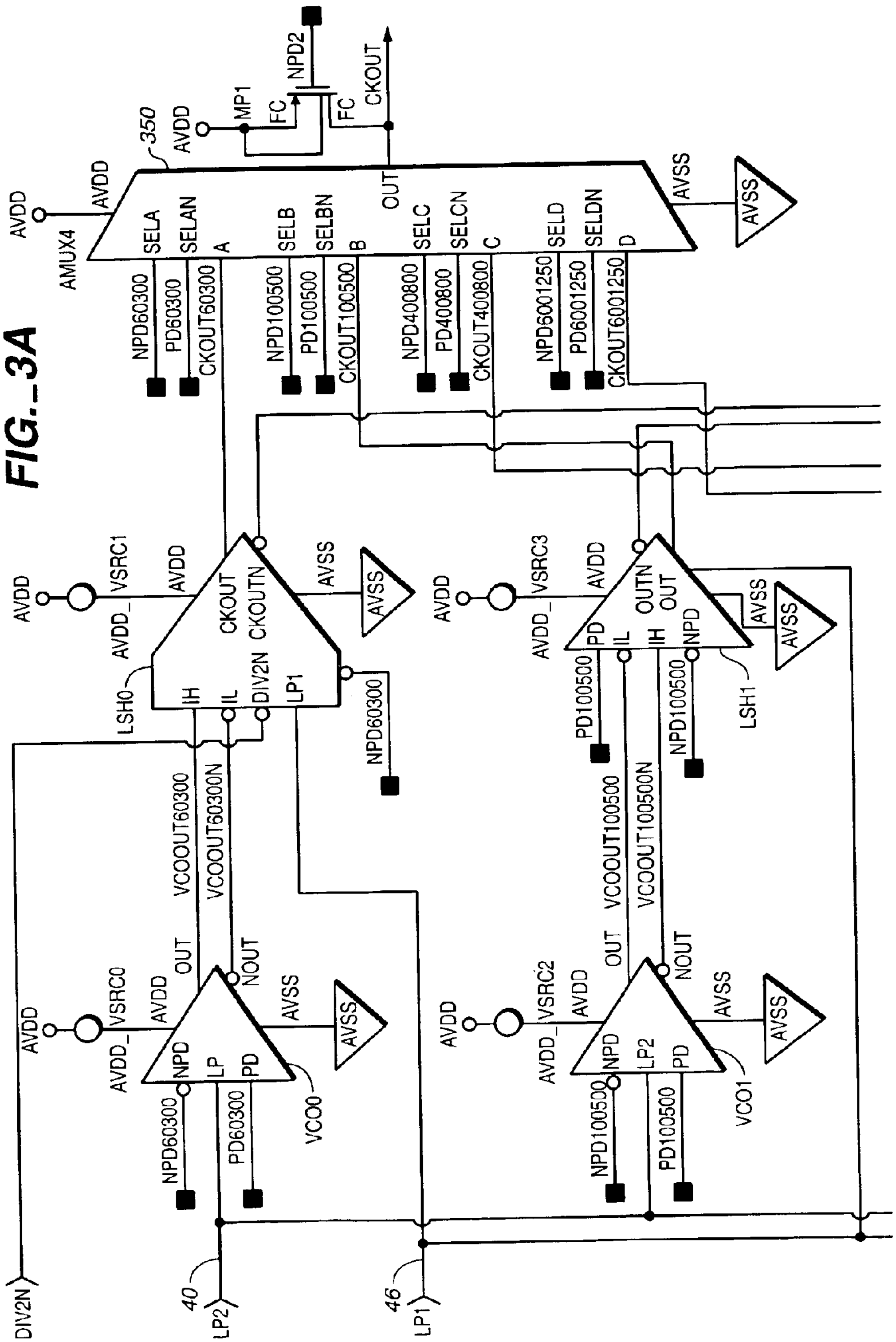
FIG._3A

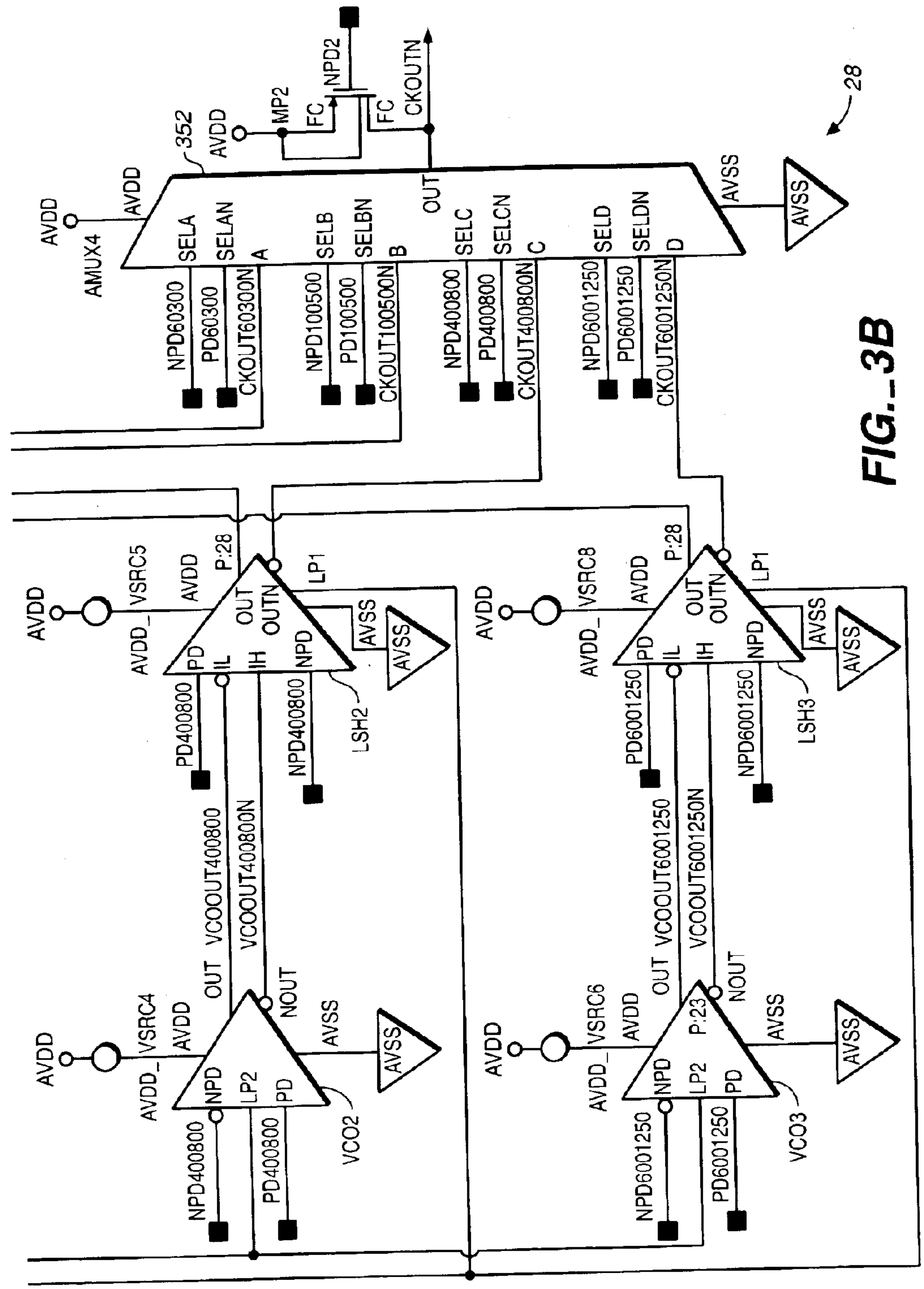
FIG._3B

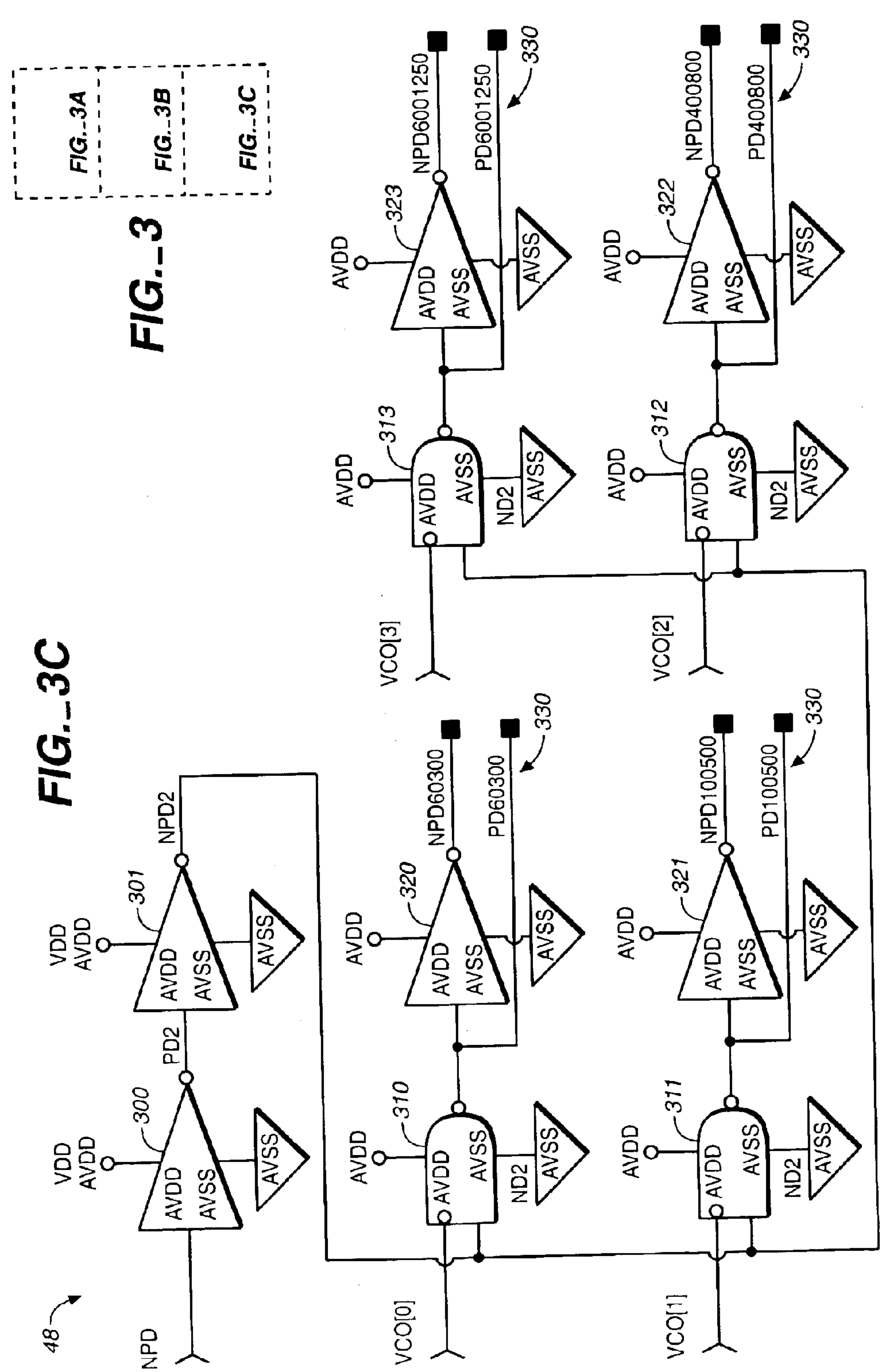
FIG._3C
FIG._3

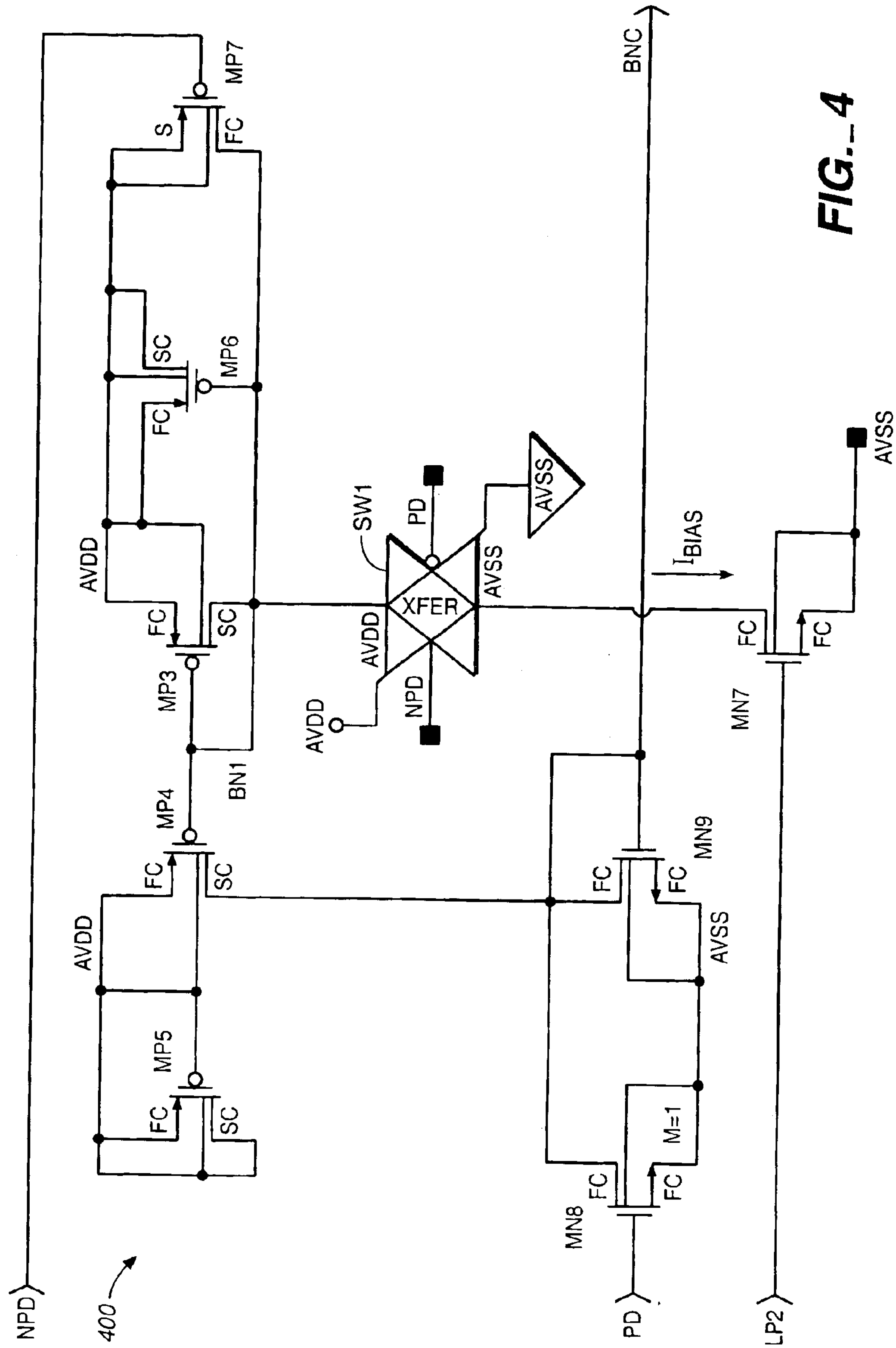
FIG._4

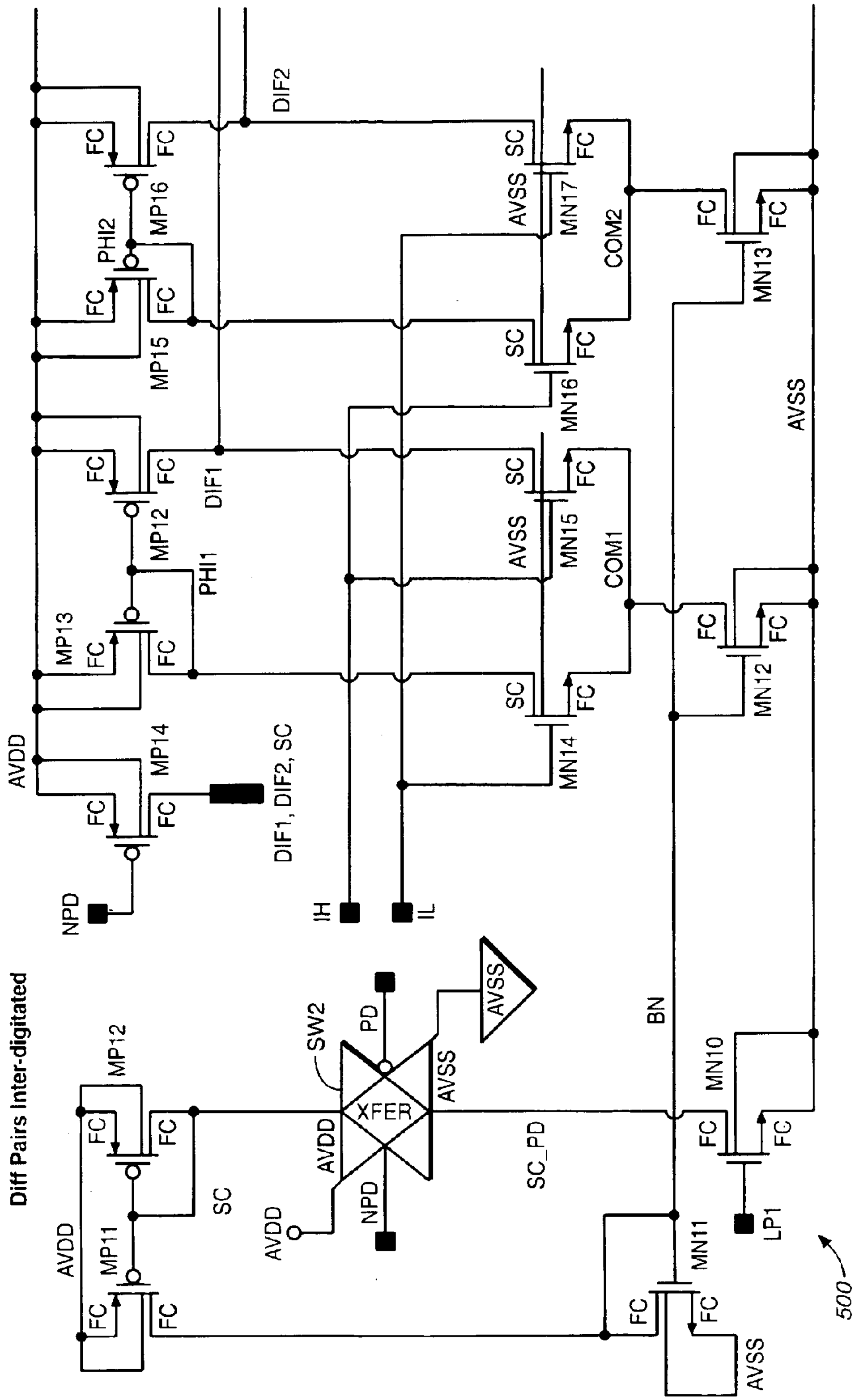
FIG._5A

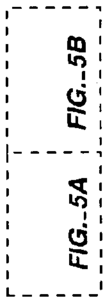
FIG._5
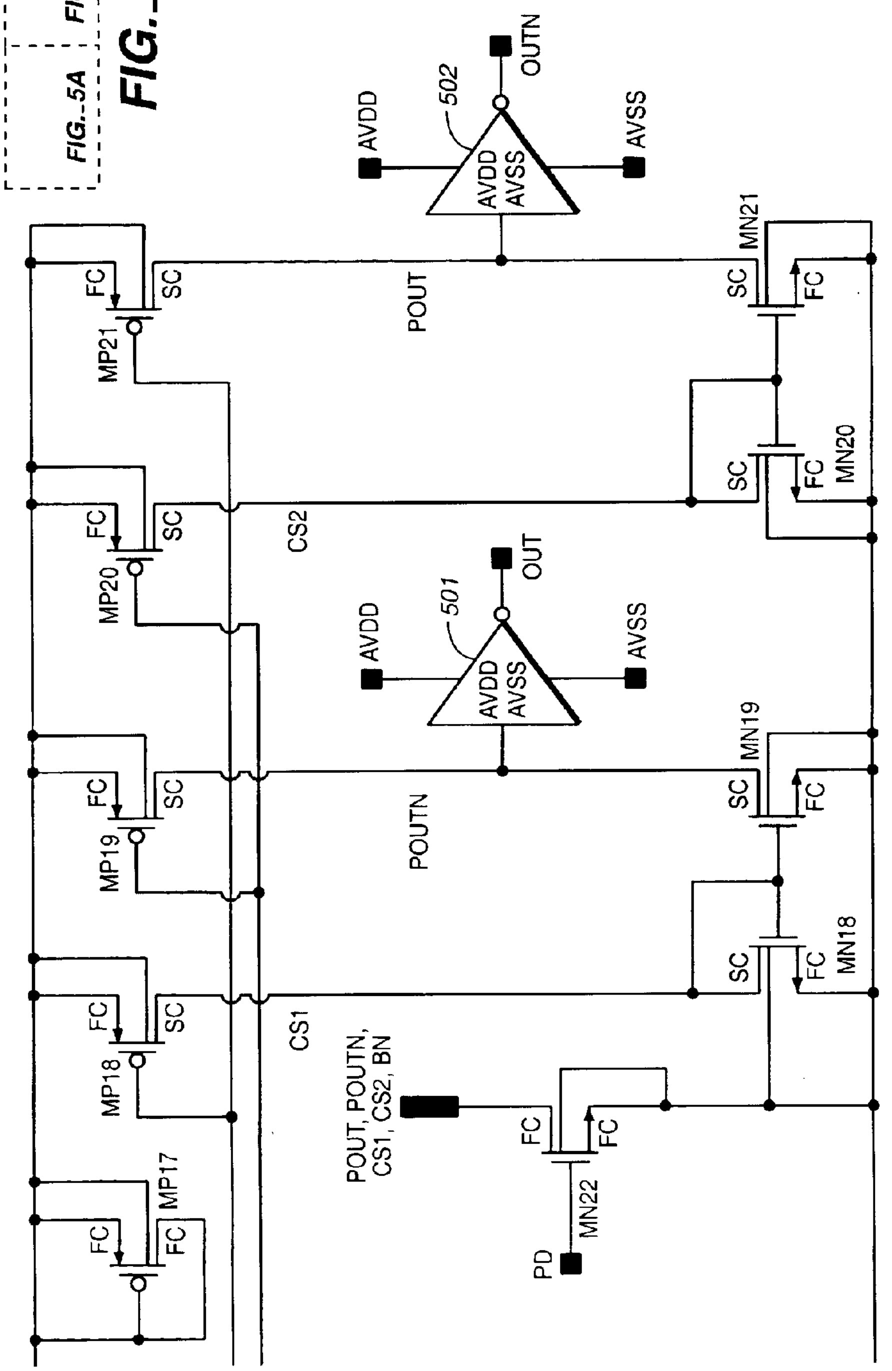
FIG._5B

PROGRAMMABLE PHASE-LOCKED LOOP

FIELD OF THE INVENTION

The present invention relates to semiconductor integrated circuits and more particularly to implementation of phase-locked loops having different operating characteristics.

BACKGROUND OF THE INVENTION

Integrated circuits are generally fabricated on a thin, circular silicon wafer or substrate. Semiconductor devices and electrical interconnections that form the integrated circuit are conventionally made by building many mask layers on top of one another on the substrate. Each successive mask layer may have a pattern that is defined using a mask. A mask has a shape used for processing features in a particular process step during fabrication. The mask layers are fabricated through a sequence of pattern definition steps using the masks, which are interspersed with other process steps such as oxidation, etching, doping and material deposition. When a mask layer is defined using a mask chosen or provided by a customer, the mask layer is programmed or customized.

The lowest, "base" layers include the active areas of the semiconductor devices, such as diffusion regions and gate oxide areas, and desired patterns of the polysilcon gate electrodes. One or more metal and insulating layers are then deposited on top of the base layers and patterned to form conductive segments, which interconnect the various semiconductor devices formed in the base layers. Electrical contacts or vias are formed to electrically connect a conductive segment of one of the metal layers with a conductive segment or semiconductor device on one of the other layers on the wafer.

Higher-level logic functions, such as phase-locked loops, are typically implemented as standard cells so they can be optimized for a desired operating frequency range. It is therefore common for ASIC vendors to include several versions of a phase-locked-loop cell, each with different operating characteristics, in a cell library so that the appropriate cell can be selected an instantiated in a design for a particular application. However, each PLL cell may have different base layer and metal layer patterns since they are implemented as standard cells. This increases the design and fabrication cycle times since the base layer masks and lower metal layer masks may change depending upon which PLL cell is selected. Also, once the integrated circuit is fabricated, the frequency range of the PLL is fixed. This leaves the end user of the integrated circuit with no flexibility to change the frequency range of the PLL.

Phase-locked loop cells are therefore desired, which allow selection of the frequency range after fabrication and for reduction in the design and fabrication cycle times associated with the implementation of these cells on a integrated circuit.

SUMMARY OF THE INVENTION

One embodiment of the present invention is directed to an integrated circuit. A phase-locked loop (PLL) is fabricated on the integrated circuit and has a selectable loop filter capacitance and a selectable output frequency range.

Another embodiment of the present invention is directed to a phase-locked loop, which includes a range select input, a clock output, a phase/frequency detector, a charge pump, a loop filter and a VCO circuit. The phase/frequency detector has a reference input and a feedback input. The charge pump is coupled to an output of the phase/frequency detector. The loop filter is coupled to an output of the charge pump. The VCO circuit is coupled to the loop filter and has a plurality of VCOs, which are selectively coupled between the loop filter and the clock output as a function of the range select input and have different output frequency ranges.

Another embodiment of the present invention is directed to a method of programming a phase-locked loop. The method includes: (a) receiving a range select signal on an integrated circuit on which the PLL is fabricated; (b) selecting a loop filter capacitance for the PLL from a plurality of selectable loop filter capacitances as a function of the range select signal; and (c) enabling a first of a plurality of VCOs in the PLL and disabling all other VCOs in the plurality as a function of the range select signal.

BRIEF DESCRIPTION OF THE DRAWINGS

FIG. 1 is a block diagram of a phase-locked-loop (PLL), which has an electrically-programmable frequency range according to one embodiment of the present invention.

FIG. 2 is a schematic diagram illustrating a programmable filter capacitor block within the PLL shown in FIG. 1, according to one embodiment of the present invention.

FIG. 3 is a schematic diagram illustrating a programmable VCO circuit within the PLL shown in FIG. 1, according to one embodiment of the present invention.

FIG. 4 is a schematic diagram of a bias circuit within each VCO shown in FIG. 3, according to one embodiment of the present invention.

FIG. 5 is a schematic diagram illustrating a level shifter within the programmable VCO circuit shown in FIG. 3, according to one embodiment of the present invention.

DETAILED DESCRIPTION OF ILLUSTRATIVE EMBODIMENTS

As semiconductor technologies advance and become more complex, the costs associated with manufacturing each of the masks that are used to fabricate an integrated circuit have increased significantly. The degree to which each mask is customized for a particular application further increases the costs associated with manufacturing the mask and increases its design time. Therefore, it is desired to reduce the level of customization of certain logic functions while still providing the customer with wide ranges of operating characteristics.

FIG. 1 is a block diagram of a phase-locked-loop (PLL) 10, which has an electrically-programmable frequency range according to one embodiment of the present invention. In this embodiment, PLL 10 is implemented as a single cell in an integrated circuit technology library, which can be selected and instantiated with other cells in an integrated circuit design for fabrication.

PLL 10 includes a reference input 12 (labeled REF), a feedback input 14 (labeled FB), complementary clock outputs 16 and 18 (labeled CKOUT and CKOUTN), and a plurality of programmable control inputs 20. PLL 10 is formed of a plurality of subcells, including phase/frequency detector 22, charge pump 24, programmable loop filter 26, programmable voltage-controlled oscillator (VCO) circuit 28 and control circuit 30.

Phase/frequency detector 22 is coupled to reference input REF and feedback input FB and has control outputs 32 and 34. Control outputs 32 and 34 are coupled to the inputs of charge pump 24. Charge pump 24 has an output 36, which is coupled to loop filter node 38 (labeled LP2) and to the control voltage input 40 of programmable VCO circuit 28. Loon filter 26 includes a programmable resistor block 42 and a programmable capacitor block 44, which are coupled in series with one another between loop filter node LP2 and ground terminal VSS. Loop filter 26 has a node LP1 between resistor block 42 and capacitor block 44, which is coupled to bias input 46 of programmable VCO circuit 28.

Programmable VCO circuit 28 generates clock outputs CKOUT and CKOUTN as a function of the voltage on loop filter node LP2. VCO circuit 28 has a plurality of control inputs 48 for programming the operation of the circuit. These inputs include an active low global power down input NPD, an active low divide-by-two control input DIV2NM, and a 4-bit VCO select input VCO[3:0]. As described in more detail below, the bits of VCO[3:0] are programmed to select one of four voltage-controlled oscillators in circuit 28, each of which having a different output frequency range. The unused VCO's are powered down to reduce power consumption.

During operation, the selected VCO in programmable VCO circuit 28 generates complementary digital clock signals on clock outputs CKOUT and CKOUTN, which have a phase and frequency that are a function of the voltage across loop filter 26 and the current supplied through output 36 of charge pump 24. One of the resulting clock output signals, such as CKOUT is fed back to the feedback input FB of phase/frequency detector 22. The clock output signal can be coupled directly to feedback input FB or can be coupled through a suitable frequency divider. In the case in which PLL 10 is implemented as a single cell in a technology library, the frequency divider can be internal and external to the PLL cell.

Phase/frequency detector 22 detects a phase/frequency difference between reference input REF and feedback input FB. Phase/frequency detector 22 can include a variety of detectors such as a three-state type detector, which generates up "UP" and down "DN" signals on outputs 32 and 34 as a function the phase/frequency difference between reference input REF and feedback input FB. In one embodiment, the UP and DN signals are pulse-width modulated as a function of the phase/frequency difference. Charge pump 24 pumps charge onto loop filter 26, pumps charge off of loop filter 26, or does not change the charge on loop filter 26 as a function of the UP and DN signals. VCO circuit 28 then responsively increases, decreases, or does not change the frequency of oscillation on clock outputs CKOUT and CKOUTN as a function of the voltage across loop filter 26.

As mentioned above, loop filter 26 and VCO circuit 28 are programmable to provide different frequency ranges on clock outputs CKOUT and CKOUTN. These frequency ranges are programmable through control inputs 20. Control inputs 20 include a 3-bit frequency range select input RANGE[2:0], a 2-bit charge pump control input P[1:0], a 4-bit zero select input Z[3:0], an enable input ENABLE and a third-order control input HDIV. Control circuit 30 decodes the logic states supplied to control inputs 20 and generates corresponding logic states on control outputs 50.

Control outputs 50 include resistor select output RSEL [3:0], charge pump select output PSEL[1:0], VCO select output VCO[3:0], capacitor select output CSEL[1:0], complementary global power down outputs PD and NPD, third-order smoothing output HDIVM, and divide-by-two control output DIV2NM.

ENABLE is used to enable or disable PLL 10. When ENABLE is active, PD and NPD are inactive (such as low and high, respectively). The PD and NPD signals are routed to the various elements of PLL 10. For example, PD is routed to charge pump 24, and NPD is routed to phase/frequency detector 22 and VCO circuit 28. When ENABLE is inactive, PD and NPD are active and turn off the current sources and bias voltage generators within phase/frequency detector 22, charge pump 24 and VCO circuit 28. Power down outputs PD and NPD are used as global control signals for powering down the various elements of PLL 10 when the PLL is disabled.

Third-order smoothing input HDIV controls the state of output HDIVM, which is provided to capacitor circuit 44. When active, HDIVM adds a third-order filter capacitance to loop filter 26 for smoothing third-order frequencies on loop filter node LP2, as described in more detail with reference to FIG. 2.

Control input P[1:0] is used to control the amount of current pumped onto and off of loop filter node LP2, through charge pump control output PSEL[1:0]. In one embodiment, the two bits of PSEL[1:0] select between integer multiples of a base current, such as 1×, 4×, 8× and 16×, which can be pumped onto and off of LP2.

Zero control input z[3:0] is used to select the location of the zero in the transfer function of loop filter 26. The bits of Z[3:0] are decoded to produce a pattern on RSEL[3:0] that selects a desired resistance through loop filter resistor circuit 42. Loop circuit 42 includes a plurality of resistors R1–RN, which are selectively coupled in parallel with one another through respective switches RS1–RSN. Switches RS1–RSN are coupled in series with the respective switches RS1–RSN, between LP2 and LP1. In one embodiment, switches RS1–RSN are implemented as a multiplexer. Any number of resistors can be used. For example in one embodiment, twelve resistor legs are used to create 16 programmable resistances between LP2 and LP1.

Table 1 provides one example of the decoding of Z[3:0] to the total resistance value through loop filter resistor circuit 42 in one embodiment of the present invention for the 16 different values of Z[3:0].

TABLE 1

| Z[3:0] | TOTAL RESISTANCE VALUE | # OF LEGS | RESISTANCE VALUES USED |
|---|---|---|---|
| 0 | 250 | 4 | 1000 1000 1000 1000 |
| 1 | 250 | 4 | 1000 1000 1000 1000 |
| 2 | 300 | 4 | 1000 1000 1000 3000 |
| 3 | 400 | 3 | 1000 1000 2000 |
| 4 | 500 | 2 | 1000 1000 |
| 5 | 821 | 2 | 1000 4600 |
| 6 | 1000 | 1 | 1000 |
| 7 | 1620 | 2 | 2500 4600 |
| 8 | 2000 | 1 | 2000 |
| 9 | 2484 | 2 | 4600 5400 |
| 10 | 3000 | 1 | 3000 |
| 11 | 3525 | 2 | 6650 7500 |
| 12 | 4600 | 1 | 4600 |
| 13 | 5400 | 1 | 5400 |
| 14 | 6650 | 1 | 6650 |
| 15 | 7500 | 1 | 7500 |

Any other number of resistors, resistor legs and resistance values can be used in alternative embodiments of the present invention. The decoding of Z[3:0] allows parallel use of resistor legs for different output frequency range selections. This allows circuit 42 to be implemented with less area, as compared with the selection between multiple loop filters, each with their own filter resistors.

The primary function of range input RANGE[2:0] is to select the filter capacitance value and the VCO to be enabled. The value of RANGE[2:0] is chosen by the user based on the desired output frequency range. RANGE[2:0] is decoded to select a corresponding loop filter capacitance, through capacitance select output CSEL[1:0]. In one embodiment, circuit 44 includes three capacitors C1, C2 and C3, which are selectively coupled in parallel with one another between LP1 and VSS. Capacitor C1 has a default capacitance value and is coupled directly between LP1 and VSS. Capacitors C2 and C3 are multiplexed in parallel with capacitor C1, through switches CS2 and CS3. Switches CS2 and CS3 are selectively open and closed as a function of CSEL[1:0] to provide one of four different capacitance values, depending on the value of RANGE[2:0].

RANGE[2:0] is also decoded to enable the desired VCO in VCO circuit 28 and to disable all other VCO's as a function of the desired output frequency range. In one embodiment, control circuit 30 activates a corresponding bit in VCO[3:0] to select the desired VCO and inactivates all other bits, as a function of the value of RANGE[2:0].

FIG. 2 is a schematic diagram illustrating programmable filter capacitor circuit 44 in greater detail, according to one embodiment of the present invention. The capacitor select inputs, CSEL[0] and CSEL[1], are coupled to buffers 200 and 202, respectively. Third-order filter control input HDIVM is coupled to buffer 204. Buffer 200 includes inverters 205 and 206, which are coupled in series with one another to generate complementary control outputs CSELAN and CSELA_BUF. Buffer 202 includes inverters 207 and 208, which are coupled in series with one another to generate complementary control outputs CSELBN and CSELB_BUF. Buffer 204 includes inverters 209 and 210, which are coupled in series with one another to generate complementary control outputs C3RDN and C3RD.

Circuit 44 includes a first, primary programmable capacitor circuit 212 and a second, third-order programmable capacitor circuit 214. Primary capacitor circuit 212 is coupled between LP1 and VSS and includes capacitors C1, C2, and C3 (also shown in FIG. 1), which are implemented with the gate capacitances of N-channel transistors MN1–MN3, respectively. However, capacitors C1, C2 and C3 can be implemented with other devices or structures in alternative embodiments and with alternative transistor technologies.

Each transistor MN1–MN3 can include a single transistor or an array of multiple transistors coupled together in parallel. Transistor MN1 has a gate coupled to LP1 and a source and drain coupled to VSS. Transistor MN2 has a gate coupled to LP1 through switch CS2 and a source and drain coupled to VSS. Similarly, transistor MN3 has a gate coupled to LP1 through switch CS3 and a source and drain coupled to VSS. In this embodiment, switches CS2 and CS3 are implemented as pass gates. Switch CS2 has complementary switch control inputs coupled to CSELAN and CSELA_BUF. Switch CS3 has complementary switch control inputs coupled to CSELBN and CSELB_BUF.

The capacitance of circuit 212, as measured between LP1 and VSS is controlled by the states of CSEL[0] and CSEL[1]. When CSEL[0] is high, CSELAN is low and CSELA_BUF is high. Switch CS2 is closed and couples capacitor C2 (transistor MN2) in parallel with capacitor C1 (transistor MN1). When CSEL[0] is low, switch CS2 is open and capacitor C2 is decoupled from capacitor C1. Similarly, when CSEL[1] is high, CSELBN is low and CSELB_BUF is high. Switch CS3 is closed and couples capacitor C3 (transistor MN3) in parallel with capacitor C1 (transistor MN1). When CSEL[1] is low, switch CS3 is open and decouples C3 from C1.

Table 2 provides an example of selectable capacitance values in circuit 212 as a function of RANGE[2:0] and the desired output frequency range, according to one embodiment of the present invention. Table 2 incorporates the decoding of RANGE[2:0] into CSEL[1:0].

TABLE 2

| RANGE[2:0] | VCO FREQ. RANGE (MHz) | CAPACITANCE (pf) | NUMBER OF TRANSISTORS |
|---|---|---|---|
| 000, 001 | 60–300 | 990 | 1100 |
| 010 | 100–500 | 585 | 650 |
| 011, 100 | 400–800 | 234 | 260 |
| 101, 110, 111 | 600–1250 | 234 | 260 |

The values in Table 2 assume that each transistor MN1–MN3 includes an array of parallel transistors, wherein each transistor has a gate width of 20 um and a gate length of 10 um. However, any transistor size can be used in alternative embodiments of the present invention. The total number of transistors used in circuit 212 for each selection of RANGE[2:0] is also provided in Table 2.

In applications in which third-order smoothing is desired, third-order filter capacitor circuit 214 is selectively coupled between LP2 and VSS by switch CS13RD. Switch CS13RD has complementary switch control inputs, which are coupled to switch control signals C3RDN and C3RD, respectively. These signals are controlled by the state of HDIVM through buffer 204.

Third order filter capacitor circuit 214 includes capacitors C13RD, C23RD and C33RD, which are selectively coupled in parallel with one another through switches CS23RD and CS33RD. In one embodiment, capacitors C13RD–C33RD are implemented with the gate capacitances of N-channel transistors MN4–MN6, respectively. Again, each transistor can include a single transistor or a plurality of transistors connected together in parallel. Transistor MN4 has a gate coupled to LP2 through switch CS13RD and a source and drain coupled to VSS. Transistor MN5 has a gate coupled to LP2 through switches CS13RD and CS23RD and a source and drain coupled to VSS. Transistor MN6 has a gate coupled to LP2 through switches CS13RD and CS33RD and a source and drain coupled to VSS.

Switch CS23RD has complementary control inputs coupled to CSELAN and CSELA_BUF, respectively. Switch CS33RD has complementary switch control inputs coupled to CSELBN and CSELB_BUF, respectively. Therefore, the total capacitance of the third-order filter capacitor circuit 214 is a function of the values of CSEL[1:0].

Table 3 provides an example of the total third-order capacitance for various values of RANGE[2:0] according to one embodiment of the present invention.

TABLE 3

| RANGE[2:0] | VCO FREQ. RANGE (MHz) | CAPACITANCE (pf) | NUMBER OF TRANSISTORS |
|---|---|---|---|
| 000, 001 | 60–300 | 32.4 | 36 |
| 010 | 100–500 | 16.2 | 18 |
| 011, 100 | 400–800 | 8.1 | 9 |
| 101, 110, 111 | 600–1250 | 8.1 | 9 |

Again, each transistor in C13RD–C33RD is assumed to have a gate width of 20 um and a gate length of 10 um, for example.

FIG. 3 is a schematic diagram illustrating programmable VCO circuit 28 in greater detail. Circuit 28 includes four independent VCO's, including VCO0, which has an output frequency range of 60 MHz to 300 MHz, VCO1, which has an output frequency range of 100 MHz to 500 MHz, VCO2, which has an output frequency range of 400 MHz to 800 MHz, and VCO3, which has an output frequency range of 600 MHz to 1250 MHz. VCO0–VCO3 are selectively enabled and disabled as a function of VCO select inputs VCO[3:0] and global power down input NPD.

Global power input NPD is coupled to series inverters 300 and 301, which generate complementary global power down control signals PD2 and NPD2, respectively. VCO select inputs VCO[3:0] are coupled to the first inputs of respective logic NAND gates 310–313. The second input of each NAND gate 310–313 is coupled to NPD2. The output of each NAND gate 310–313 provides an active-high enable signal for each VCO0–VCO3. These enable signals are labeled PD60300, PD100500, PD400800 and PD6001250. Inverters 320–323 are coupled to the outputs of NAND gates 310–313, respectively, for generating an active-low enable output for each VCO0–VCO3. The active-low enable signals are labeled NPD60300, NPD100500, NPD400800 and NPD6001250.

NAND gate 310 and inverter 320 therefore generate a pair of complementary select outputs PD6300 and NPD60300 for enabling and disabling VCO0. NAND gate 311 and inverter 321 generate a pair of complementary select outputs PD100500 and NPD100500 for enabling and disabling VCO1. NAND gate 312 and inverter 322 generate a pair of complementary select outputs PD400800 and NPD400800 for enabling and disabling VCO2. NAND gate 313 and inverter 323 generate a pair of complementary select outputs PD6001250 and NPD6001250 for enabling and disabling VCO3. The select outputs are collectively labeled by reference numeral 330.

Each VCO can include any suitable VCO circuit, such as any of those available in the commercially available technology libraries of LSI Logic Corporation. Other types of VCO circuits can also be used. Each VCO, VCO0–VCO3, has a control voltage input LP, complementary power down inputs PD and NPD, and a pair of differential clock outputs OUT and NOUT. Control voltage input LP is coupled to loop filter node LP2 for receiving the voltage across loop filter 26. Power down inputs PD and NPD are coupled to respective complementary pairs of select outputs 330.

When the power down inputs PD and NPD of a particular VCO are active, the respective VCO is powered down by turning off all internal bias voltage generators and current sources. When the power down inputs PD and NPD of a particular VCO are inactive, the respective VCO operates normally to generate a differential clock signal on its outputs OUT and NOUT as a function of the voltage on LP2.

Only one VCO is enabled at one time. Control circuit 30 (shown in FIG. 1) activates only one VCO select input bit VCO[3:0] at one time in order to enable one VCO in circuit 28. All remaining VCO's are disabled. For example, if VCO[0] is active (e.g., set to a logic high level), then VCO[3:1] are all inactive. PD60300 and NPD6300 will be inactive (enabling VCO0), and all remaining VCO select outputs PD100500, NPD100500, PD400800, NPD400800, NPD6001250, and PD6001250 will be active, thereby disabling unused VCO's, VCO1–VCO3. Also, if the global power down input NPD to circuit 28 is active, all select outputs 330 will be active, thereby powering down all VCOs in circuit 28.

The differential clock outputs OUT and NOUT of each VCO are coupled to the differential inputs IH and IL of a respective level shifting clock buffer LSH0–LSH3, respectively. Level shifters LSH0–LSH3 each includes a pair of complementary power down control inputs PD and NPD, which are coupled to a respective pair of select outputs 330 for powering down internal bias generators and current sources when the corresponding VCO is not selected. Level shifters LSH0–LSH3 also include a bias input coupled to LP1 for providing an internal bias level for each level shifter, as discussed in more detail below with respect to FIG. 5. In addition, level shifter LSH0 further includes a frequency divide input DIV2N, which is coupled to divide input DIV2N provided by control circuit 30 (shown in FIG. 1). When DIV2N is active, LSH0 divides the oscillating frequency produced on outputs CKOUT and CKOUTN by two relative to the frequency produced at the outputs of VCO0. This provides an extra frequency range selection at the outputs of LSH0.

When selected, level shifters LSH0–LSH3 convert the differential clock inputs received on IH and IL into digital, complementary clock signals on outputs CKOUT and CKOUTN, which are biased between the positive and negative voltage supply terminals VDD and VSS. These complementary signals preferably have a 50 percent duty cycle.

Multiplexer 350 multiplexes the clock outputs CKOUT from level shifters LSH0–LSH3 to clock output CKOUT of circuit 28 as a function of VCO select outputs 330. Similarly, multiplexer 352 multiplexes the complementary clock outputs CKOUTN of level shifters LSH0–LSH3 to clock output CKOUTN of circuit 28 as a function of VCO select outputs 330. When a corresponding pair of VCO select outputs 330 are selected by VCO[3:0], multiplexers 350 and 352 route the complementary clock outputs CKOUT and CKOUTN from the corresponding VCO and level shifter to clock outputs CKOUT and CKOUTN of circuit 28.

P-channel transistors MP1 and MP2 are coupled in series between voltage supply terminal VDD and clock outputs CKOUT and CKOUTN, respectively. Transistors MP1 and MP2 have gates coupled to global power down control signal NPD2. When NPD2 is low, indicating a global power down, transistors MP1 and MP2 pull clock outputs CKOUT and CKOUTN to a known state, in this case a logic high value.

FIG. 4 is a schematic diagram of a bias circuit 400, which is used in each VCO0–VCO3 for selectively biasing and powering-down each VCO. Bias circuit 400 includes N-channel transistors MN7–MN9, P-channel transistors MP3–MP7 and pass gate SW1. Transistor MN7 has a gate coupled to control voltage input LP2 and forms a current source, which supplies a bias current $I_{BIAS}$ as a function of the voltage on LP2. The drain of transistor MN7 is coupled to the drain of transistor MP3 through pass gate SW1. Pass gate SW1 has a pair of complementary switch control inputs coupled to complementary power down inputs PD and NPD. When PD and NPD are inactive, pass gate SW1 is closed, thereby coupling the drain of MN7 to the drain MP3. When SW1 is open, the drain of MN7 is decoupled from the drain of MP3, thereby shutting down the current source formed by MN7.

Transistors MP3 and MP4 are coupled together to form a current mirror, which mirrors the current $I_{BIAS}$ at the drain of MP3 into the drain of MP4. Transistor MN9 has a gate and drain coupled to the drain of MP4 and a source and substrate coupled to ground terminal VSS. When the respective VCO is enabled, transistor MN9 produces a bias voltage BNC on its gate as a function of $I_{BIAS}$.

Transistor MP6 has a gate coupled to node BN1 and a source and drain coupled to VDD. Transistor MP6 operates as a power supply decoupling capacitance for decoupling variances in the voltage on VDD from the voltage on BN1. Transistor MN7 is coupled in series between VDD and BN1 and has a gate coupled to NPD. When NPD is inactive (high), transistor MP7 is off, and the current mirror formed by MP3 and MP4 operates normally. When NPD is active (low), transistor MP7 is on and pulls BN1 high toward VDD, thereby turning off transistors MP3 and MP4. Transistor MP5 is a "dummy" transistor, which has no functional affect in the circuit. Transistor MN8 has a gate coupled to PD, a drain coupled to the drain of transistor MN9 and a source coupled to VSS. When PD is inactive (low), transistor MN8 is off and has no affect on the normal operation of the circuit. When PD is active (high) during power down or when the VCO is de-selected, transistor MN8 is on pulls the drain of transistor MN9 and BNC low toward VSS. Bias output BNC is coupled to a tail current source in the respective VCO.

A typical tail current source is formed by an N-channel transistor having its gate coupled to BNC. Therefore, when PD is low and NPD is high, the corresponding VCO is enabled and functions normally. When PD is high NPD is low, the corresponding VCO is powered down and each current source and bias voltage generator is turned off. This provides a significant power savings by disabling the current paths within each disabled VCO.

FIG. 5 is a schematic diagram illustrating the level shifters LSH0–LSH3 in greater detail. However, LSH0 further includes a divide-by-two frequency divider, which is not shown in FIG. 5. Each level shifter circuit includes N-channel transistors MN10–MN22, P-channel transistors MP10–MP21, pass gate SW2 and inverters 501 and 502.

The voltage on bias voltage input LP1 is used to set a bias voltage BN for tail current sources MN12 and MN13. LP1 is coupled to the gate of transistor MN10, which sources a bias current through pass gate SW2. Pass gate SW2 is selectively enabled and disabled by power down inputs PD and PND. When disabled, switch SW2 decouples the bias current from MN10. Transistors MP10 and MP11 are coupled to form a current mirror which mirrors the current in the drain of MP10 into the drain of MP11. Transistor MN11 has a gate and drain coupled to bias node BN and a source coupled to VSS for generating bias voltage on BN as the function of the bias current developed by MN10.

Transistors MN12 and MN13 form tail current sources for cross-coupled, differential transistor pairs formed by transistors MN14 and MN15 and by transistors MN16 and MN17. Transistor MN12 is coupled in series between COM1 and VSS and has a gate coupled to BN. Similarly, transistor MN13 is coupled in series between COM2 and VSS and has a gate coupled to BN. Transistors MN12 and MN13 set up appropriate bias current levels for the cross-coupled differential pairs as a function of the voltage on BN.

Current through cross-coupled differential transistor pairs is controlled by the relative voltage levels on differential inputs IH and IL. IH is coupled to the gates of transistors MN15 and MN16, and IL is coupled to the gates of transistors MN14 and MN17. Differential transistor pair MN14 and MN15 steer the tail current through DIF1 and PHIL as a function of the relative voltage levels on IH and IL. Similarly, MN16 and MN17 steer the tail current through DIF2 and PHI2 as a function of the relative voltage levels on IH and IL.

Transistors MP12 and MP13 form a current mirror for mirroring the current through PHIL into DIF1. Transistor MP15 and MP16 form a current mirror for mirroring the current through PHI2 to DIF2. With this arrangement, DIF1 and DIF2 form complementary signals, which follow the relative states of IH and IL and have approximately 50 percent duty cycles, even if the duty cycles on IH and IL are not precisely 50 percent.

Output drive circuit 510 receives the relative voltage levels on DIF1 and DIF2 and shifts the voltage levels toward rail-to-rail levels to produce complementary digital outputs on OUT and OUTN. Transistor MN18, MN19, MP18 and MP19 generate a first digital output POUTN as a function of the relative logic states of DIF1 and DIF2, wherein POUTN generally follows the state of DIF1 and the inverse of DUF2. Similarly, transistors MN20, MN21, MP20 and MP21 generate a complementary output signal POUT as a function of the relative logic states of DIF1 and DIF2, wherein POUT generally follows the logic state of DIF2 and the inverse of DIF1. Inverters 501 and 502 operate as output buffers, which generate OUT and OUTN as a function of POUTN and POUT, respectively.

Power down control transistor MN22 has a gate coupled to PD and has a drain coupled POUT, POUTN, CS1, CS2 and BN for pulling these nodes low toward VSS when PD is active. This drives outputs OUT and OUTN to known states, turns off tail current sources MN12 and MN13, and turns off output drive transistors MN19 and MN21.

Similarly, power down control transistor MP14 selectively pulls nodes DIF1, DIF2 and SC to a logic high state during power down when NPD is active. This turns off transistors MP18–MP21 and MP10 and MP11. Transistor MP17 is a dummy transistor, which is used for fabrication purposes but has no functional affect on the circuit. Power down inputs PD and NPD are activated when the corresponding VCO is not selected, as described with reference to FIG. 3. Therefore when the corresponding VCO is unused, the bias voltage and current sources in level shifter circuit 500 are turned off to save power.

With the above-described embodiments, a single PLL library cell is provided, which has a very wide frequency range and allows the user to reconfigure the frequency range after the PLL has been fabricated on an integrated circuit. The PLL is reconfigured through electrically programmable inputs. These inputs can be driven by any suitable method, such as control registers or inputs pins of the integrated circuit. The exceptionally wide output frequency range of the PLL is accomplished by partitioning the frequency range and assigning a single VCO to cover each range. In the embodiment described above, there are four VCO's inside the PLL, each covering a specific range. The PLL selects the appropriate VCO and loop filter characteristics as a function of user programming. The non-selected VCO's and support circuits are powered down to reduce power consumption. The outputs of all the VCO's are multiplexed together to form the clock output of the PLL. Since the PLL loop capacitor is programmable and automatically selected based on the selected frequency range, stable operation of the PLL can be achieved over all frequency ranges. In addition, each level shifter is independently powered down when not in use.

Table four provides an example of the VCO output frequency range and the reference input frequency range for each value of RANGE[2:0], according to one embodiment of the present invention.

TABLE 4

| RANGE | VCO Frequency Range (MHz) | | M Div Range | | Ref Frequency Range (MHz) | |
|---|---|---|---|---|---|---|
| [2:0] | min | max | min | max | min | max |
| 000 | 60 | 150 | 1 | 32 | 1.9 | 150 |
| 001 | 150 | 300 | 1 | 64 | 2.3 | 300 |
| 010 | 300 | 500 | 1 | 64 | 4.7 | 500 |
| 011 | 500 | 800 | 2 | 64 | 7.8 | 400 |
| 100 | 500 | 800 | 1 | 1 | 500 | 800 |
| 101 | 800 | 1250 | 4 | 64 | 12.5 | 312.5 |
| 110 | 800 | 1250 | 2 | 3 | 267 | 625 |
| 111 | 800 | 1250 | 1 | 1 | 800 | 1250 |

Although the present invention has been described with reference to preferred embodiments, workers skilled in the art will recognize that changes may be made in form and detail without departing from the spirit and scope of the invention. The term "coupled" as used in the specification and in the claims can include a direct connection or a connection through one or more additional components.

What is claimed is:

1. A phase-locked loop (PLL) comprising:

a range select input;

a clock output;

a phase/frequency detector having a reference input and a feedback input;

a charge pump coupled to an output of the phase/frequency detector;

a loop filter coupled to an output of the charge pump;

a voltage-controlled oscillator CVCO) circuit coupled to the loop filter and comprising a plurality of VCOs, which are selectively coupled between the loop filter and the clock output as a function of the range select input and have different output frequency ranges; and a plurality of voltage level shifters, wherein each voltage level shifter is coupled between a respective one of the VCO's and the clock output and is adapted to convert differential signals produced at an output of the respective VCO into a digital logic level signal, and wherein each voltage level shifter comprises a power down input and at least one current source or voltage bias generator, which is enabled and disabled by the power down input.

2. The PLL of claim 1 wherein each voltage level shifter has a voltage level shifter output and the PLL further comprises a multiplexer having a plurality of multiplexer inputs coupled to respective voltage level shifter outputs, a select input controlled by the range select input and a multiplexer output coupled to the clock output.

3. The PLL of claim 1 wherein each VCO comprises a power down input coupled to the range select input and at least one current source in the VCO, which is enabled and disabled by the power down input.

4. The PLL of claim 1 wherein each VCO comprises a power down input coupled to the range select input and at least one bias voltage generator in the VCO, which is enabled and disabled by the power down input.

5. The PLL of claim 1 wherein the PLL further comprises a control circuit, which decodes the range select input into a plurality of VCO select signals and a capacitance select signal, wherein each of the VCOs is enabled and disabled as a function of a respective one of the VCO select signals and the loop filter has a capacitance that is selectable as a function of the capacitance select signal.

6. The PLL of claim 1 wherein the loop filter comprises a resistor connected in series with a programmable capacitor circuit, wherein the programmable capacitor circuit comprises a plurality of capacitors, which are selectively coupled in parallel with one another as a function of the range select input.

7. The PLL of claim 6 wherein the PLL further comprises a third-order loop filter capacitor circuit coupled in parallel with the series connection of the resistor and the programmable capacitor circuit and having a plurality of third-order capacitors, which are selectively coupled in parallel with one another as a function of the range select input.

8. An integrated circuit comprising a phase-locked loop (PLL), which is fabricated on the integrated circuit and comprises a selectable loop filter capacitance and a selectable output frequency range, wherein the PLL further comprises: a clock output; a loop filter providing the loop filter capacitance; a plurality of voltage-controlled oscillators (VCOs), which are selectively coupled between the loop filter and the clock output as a function of a range select input and have different output frequency ranges, and a plurality of voltage level shifters, wherein each voltage level shifter is coupled between a respective one of the VCO's and the clock output and is adapted to convert differential signals produced at an output of the respective VCO into a digital logic level signal, and wherein each voltage level shifter comprises a power down input and at least one current source or voltage bias generator, which is enabled and disabled by the power down input.

9. The integrated circuit of claim 8 wherein the PLL further comprises a control circuit, which decodes the range select input into a plurality of VCO select signals and a capacitance select signal, wherein each of the VCOs is enabled and disabled as a function of a respective one of the VCO select signals and the loop filter capacitance is selectable as a function of the capacitance select signal.

10. The integrated circuit of claim 8 wherein the loop filter capacitance and the output frequency range are selectable as a function of the range select input.

11. The integrated circuit of claim 8 wherein each VCO comprises a power down input coupled to the range select input and at least one bias voltage generator in the VCO, which is enabled and disabled by the power down input.

12. The integrated circuit of claim 8 wherein each voltage level shifter has a voltage level shifter output and the PLL further comprises a multiplexer having a plurality of multiplexer inputs coupled to respective voltage level shifter outputs, a select input controlled by the range select input and a multiplexer output coupled to the clock output.

13. The integrated circuit of claim 8 wherein each VCO comprises a power down input coupled to the range select input and at least one current source in the VCO, which is enabled and disabled by the power down input.

14. The integrated circuit of claim 8 wherein the loop filter comprises a resistor connected in series with a programmable capacitor circuit, wherein the programmable capacitor circuit comprises a plurality of capacitors, which are selectively coupled in parallel with one another as a function of the range select input.

15. The integrated circuit of claim 14 wherein the PLL further comprises a third-order loop filter capacitor circuit coupled in parallel with the series connection of the resistor and the programmable capacitor circuit and having a plurality of third-order capacitors, which are selectively coupled in parallel with one another as a function of the range select input.

16. A method of programming a phase-locked loop, the method comprising:

(a) receiving a range select signal on an integrated circuit on which the PLL is fabricated;

(b) selecting a loop filter capacitance for the PLL from a plurality of selectable loop filter capacitances as a function of the range select signal;

(c) enabling a first of a plurality of voltage-controlled oscillators (VCOs) in the PLL and disabling all other VCOs in the plurality as a function of the range select signal; and (d) converting differential signals produced at an output of each respective VCO, when enabled, into a digital logic level signal by a respective voltage level shifter, wherein each voltage level shifter comprises a power down input and at least one current source or voltage bias generator, which is enabled and disabled by the power down input.

17. The method of claim 16 wherein the step of disabling all other VCOs comprises powering down at least one current source or voltage bias generator the other VCOs in the plurality as a function of the range select signal.

* * * * *